United States Patent
Lee et al.

(10) Patent No.: US 12,428,580 B2
(45) Date of Patent: Sep. 30, 2025

(54) CMP COMPOSITION INCLUDING AN ANIONIC ABRASIVE

(71) Applicant: CMC Materials, Inc., Aurora, IL (US)

(72) Inventors: Yang-Yao Lee, Tainan (TW); Hsin-Yen Wu, Kaohsiung (TW); Kevin P. Dockery, Aurora, IL (US); Na Zhang, Naperville, IL (US); Chi-Rung Shie, Kaohsiung (TW)

(73) Assignee: CMC Materials LLC, Aurora, IL (US)

( * ) Notice: Subject to any disclaimer, the term of this patent is extended or adjusted under 35 U.S.C. 154(b) by 179 days.

(21) Appl. No.: 17/895,967

(22) Filed: Aug. 25, 2022

(65) Prior Publication Data

US 2023/0070776 A1 Mar. 9, 2023

Related U.S. Application Data

(60) Provisional application No. 63/237,095, filed on Aug. 25, 2021.

(51) Int. Cl.
*C09G 1/02* (2006.01)
*C09K 3/14* (2006.01)
*H01L 21/321* (2006.01)

(52) U.S. Cl.
CPC .............. *C09G 1/02* (2013.01); *C09K 3/1454* (2013.01); *H01L 21/3212* (2013.01)

(58) Field of Classification Search
CPC ...... C09G 1/02; C09K 3/1454; H01L 21/3212
USPC .............................. 438/690–693; 51/307–309
See application file for complete search history.

(56) References Cited

U.S. PATENT DOCUMENTS

| | | |
|---|---|---|
| 6,776,810 B1 | 8/2004 | Cherian |
| 2009/0221213 A1 | 9/2009 | Namie |
| 2010/0252774 A1 | 10/2010 | Shida |
| 2011/0081780 A1 | 4/2011 | Shida |
| 2013/0327977 A1 | 12/2013 | Singh |
| 2015/0184028 A1 | 7/2015 | Jung |
| 2017/0066944 A1* | 3/2017 | Cui ......................... C09G 1/02 |
| 2020/0291267 A1 | 9/2020 | Lauter |
| 2021/0108106 A1* | 4/2021 | Liang .................. H01L 21/3212 |
| 2022/0145130 A1* | 5/2022 | Turner .................. B24B 37/044 |

FOREIGN PATENT DOCUMENTS

| | | |
|---|---|---|
| EP | 3792327 A1 | 3/2021 |
| JP | 2010258418 A | 11/2010 |
| JP | 2012015462 A | 1/2012 |
| JP | 2021093457 A | 6/2021 |
| TW | 200915412 A | 4/2009 |
| TW | 202129739 A | 8/2021 |
| WO | 2019055749 A1 | 3/2019 |
| WO | 2021076352 A1 | 4/2021 |
| WO | 2022060735 A1 | 3/2022 |

OTHER PUBLICATIONS

Science Direct, Polyaminoacids (Year: 2017).*
Science Direct, alumina particles (Year: 2014).*
Millipore Sigma, poly(diallylmethylammonium) salt. (Year: 2024).*

* cited by examiner

*Primary Examiner* — Duy Vu N Deo

(57) ABSTRACT

A chemical mechanical polishing composition comprises, consists of, or consists essentially of a liquid carrier, anionic particles dispersed in the liquid carrier, an anionic polymer or surfactant, and a cationic polymer.

28 Claims, No Drawings

CMP COMPOSITION INCLUDING AN ANIONIC ABRASIVE

FIELD OF THE INVENTION

The disclosed embodiments relate to chemical mechanical polishing compositions and more particularly to compositions including an anionic abrasive, a cationic polymer, and an anionic polymer or anionic surfactant.

BACKGROUND OF THE INVENTION

A number of chemical-mechanical polishing (CMP) operations are used in both front-end-of-the-line (FEOL) and back-end-of-the-line (BEOL) processing of semiconductor devices. For example, shallow trench isolation (STI) is an FEOL process used prior to forming the transistors to create a pattern of inlaid tetraethyl orthosilicate (TEOS) in the silicon wafer. Tungsten plug and interconnect and copper interconnect and dual damascene processes are BEOL processes used to create the network of metal wires that connect the device transistors. In these processes metal layers are deposited in openings formed in a dielectric material (e.g., TEOS). CMP is used to remove the excess metal from the dielectric and thereby form conductive plugs and/or interconnects therein.

As transistor sizes continue to shrink, the use of conventional interconnect technology has become increasingly challenging. Recently, molybdenum has emerged as a candidate metal for advanced node applications, for example, to replace copper and/or tungsten in the lower metal layers of the BEOL interconnect structure (e.g., in the M1, M2, and/or M3 layers). With the potential introduction of molybdenum as a plug and interconnect metal, there is an emerging need for CMP slurries that are able to planarize molybdenum containing substrates.

In developing commercial CMP compositions there is often a complex tradeoff between various important performance metrics. Such metrics include, for example, colloidal and chemical stability of the composition, removal rate of the substrate material during polishing (e.g., of tungsten metal), removal rate selectivity of various materials in the substrate, corrosion and etch inhibition, topography control, cleanability, and others. Moreover, as is well known, the semiconductor industry is subject to continuing and sometimes extreme downward pricing pressure. Such pricing pressure poses a challenge to the slurry formulator, as the pressure to reduce costs often conflicts with the objective of meeting certain performance metrics. Despite many recent advances in CMP compositions, there remains a need for improved CMP compositions.

BRIEF SUMMARY OF THE INVENTION

A chemical mechanical polishing composition is disclosed. The composition comprises, consists of, or consists essentially of a liquid carrier, anionic particles dispersed in the liquid carrier, an anionic polymer or surfactant, and a cationic polymer. In certain embodiments configured for tungsten (W) and/or (Mo) CMP, the composition may further optionally include an iron-containing accelerator and a stabilizer bound to the iron-containing accelerator.

DETAILED DESCRIPTION OF THE INVENTION

Chemical mechanical polishing compositions are disclosed. In one embodiment, the composition includes a liquid carrier and anionic particles (such as anionic silica and/or anionic alumina particles) dispersed in the liquid carrier. The polishing composition further includes an anionic polymer or surfactant and a cationic polymer in the liquid carrier. In certain advantageous embodiments, the amounts of anionic polymer and/or surfactant and the cationic polymer in the composition may be selected such that a ratio of the total number of negative charges on the anionic polymer to the total number of positive charges on the cationic polymer at the pH of the composition is greater than about 1 (or greater than about 1 and less than about 10).

While the disclosed embodiments are not limited in this regard, the disclosed composition may be advantageously used to polish tungsten and/or molybdenum containing substrates (e.g., in a W or Mo CMP operations). In such embodiments, the composition may further optionally include an iron containing polishing accelerator and a stabilizer as described in more detail below. Moreover, in such embodiments the disclosed compositions may be configured for either bulk W or Mo removal CMP operations (which are sometimes referred to in the art as first step CMP operations), buff CMP operations (which are sometimes referred to as second step tungsten CMP operations), or a single step CMP operation. As known to those of ordinary skill in the art, bulk removal operations generally require higher removal rates and low etch rates while buff operations require low defectivity and low erosion and dishing. Single step operations require both high removal rates and low defectivity.

The disclosed polishing compositions have been found to advantageously provide significantly improved topography control (e.g., improved dishing and erosion) across a wide range of features sizes as compared to other compositions utilizing anionic particles. Moreover, the disclosed compositions tend to be highly colloidally stable and provide excellent cleanability (and low defectivity). When used in a tungsten CMP operation, the disclosed compositions tend to further provide a suitably high tungsten removal rate and a low tungsten etch rate and may therefore be suitable for bulk, buff, and single step CMP operations (depending on the device requirements).

The disclosed polishing compositions generally contain anionic abrasive particles suspended in a liquid carrier. The liquid carrier is used to facilitate the application of the abrasive particles and various optional chemical additives to the surface of the substrate to be polished (e.g., planarized). The liquid carrier may include any suitable carrier (e.g., a solvent) including lower alcohols (e.g., methanol, ethanol, etc.), ethers (e.g., dioxane, tetrahydrofuran, etc.), water, and mixtures thereof. The liquid carrier preferably consists of, or consists essentially of, deionized water.

The disclosed polishing compositions include anionic abrasive particles. By "anionic" it is meant that the particles have a negative surface charge in the composition (e.g., at the pH of the composition). As is known to those of ordinary skill in the art, the charge on dispersed particles such as colloidal silica particles or colloidal alumina particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential of a dispersion such as a polishing composition may be obtained using commercially available instrumentation such as the Zetasizer® available from Malvern® Instruments, the ZetaPlus Zeta Potential Analyzer available from Brookhaven Instruments, and/or an electro-acoustic spectrometer available from Dispersion Technologies, Inc.

In the disclosed polishing compositions, the anionic particles may have a negative charge (a negative zeta potential) of about 10 mV or more (e.g., about 15 mV or more, about 20 mV or more, or about 25 mV or more). The anionic particles may further have a negative charge of about 50 mV or less in the polishing composition. For example, the anionic particles may have a zeta potential in a range from about negative 10 to about negative 50 mV (e.g., from about negative 15 to about negative 50 mV, from about negative 20 to about negative 50, or from about negative 25 to about negative 50).

The anionic particles may include substantially any suitable anionic particles, for example including anionic silica particles, anionic alumina particles, or substantially any other suitable anionic particles. Anionic silica particles may include, for example, anionic fumed silica and/or anionic colloidal silica particles. Anionic alumina particles may include, for example, anionic alpha alumina particles and/or fumed alumina particles.

As used herein the term colloidal silica particles refers to silica particles that are prepared via a wet process rather than the pyrogenic or flame hydrolysis process used to produce fumed silica, which are structurally different particles. Colloidal silica may be precipitated or condensation-polymerized silica, which may be prepared using any method known to those of ordinary skill in the art, such as by the sol gel method or by silicate ion-exchange. Condensation-polymerized silica particles are often prepared by condensing $Si(OH)_4$ to form substantially spherical particles.

As used herein the term alpha alumina refers to alumina particles including about 50 weight percent or more of the alpha polymorph of alumina which is generally obtained via the calcination of bauxite (aluminum hydroxide) at temperatures in excess of 1400 degrees C. and then milled to obtain appropriately sized particles. Fumed alumina, like fumed silica, is obtained by a pyrogenic or flame hydrolysis process and generally has an aggregate structure in which approximately spherical primary particles are fused together into chain-like aggregates.

Silica particles may be anionic in their natural state at the pH of the polishing composition (for certain compositions). Alumina tends to be cationic in acidic compositions. In preferred embodiments, the anionic particles (e.g., the anionic silica particles or the anionic alumina particles) may be rendered anionic at the pH of the polishing composition via surface metal doping and/or chemical surface treatment (or partial surface treatment), for example, with an organic acid, a sulfur-based acid, a phosphorus-based acid, and/or an anionic polymer. Such treatment methodologies are known to those of ordinary skill in the art (e.g., as disclosed in U.S. Pat. No. 9,382,450).

The anionic particles in the disclosed embodiments may have substantially any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, Louisiana) or the Zetasizer® available from Malvern Instruments®. The abrasive particles may have an average particle size of about 10 nm or more (e.g., about 20 nm or more, about 40 nm or more, or about 50 nm or more). The abrasive particles may have an average particle size of about 200 nm or less (e.g., about 180 nm or less, about 160 nm or less, or about 150 nm or less). Accordingly, the colloidal silica particles may have an average particle size in a range from about 5 nm to about 200 nm (e.g., from about 20 nm to about 180 nm, from about 40 nm to about 160 nm, or from about 50 nm to about 150 nm).

The polishing composition may include substantially any suitable amount of the above described anionic particles, but preferably includes a low concentration of anionic particles at point of use to reduce costs. It will be understood that compositions having a low concentration of anionic particles at point of use may also be more highly concentratable, thereby potentially further reducing costs. For example, the polishing composition may include about 0.01 wt. % or more anionic particles at point of use (e.g., about 0.02 wt. % or more, about 0.05 wt. % or more, or about 0.1 wt. % or more). The amount of anionic particles in the polishing composition may include about 10 wt. % or less at point of use (e.g., about 3 wt. % or less, about 2 wt. % or less, about 1 wt. % or less, or even about 0.5 wt. % or less). Accordingly, it will be understood that the amount of anionic particles may be in a range bounded by any two of the aforementioned endpoints, for example, in a range from about 0.01 wt. % to about 10 wt. % at point of use (e.g., from about 0.01 wt. % to about 2 wt. %, from about 0.05 wt. % to about 2 wt. %, from about 0.05 wt. % to about 1 wt. %, or from about 0.05 wt. % to about 0.5 wt. %). It will be further understood that the amount of anionic particles at point of use may depend, for example, on whether the polishing composition is configured for bulk W or Mo removal or a buff operation. Those of ordinary skill will appreciate that compositions configured for bulk removal tend to include lower amounts of anionic particles (e.g., from about 0.1 weight percent to about 0.5 weight percent) while compositions configured for buffing operations tend to include higher amounts of anionic particles (e.g., from about 1 weight percent to about 6 weight percent).

The disclosed polishing composition further includes a cationic polymer and an anionic polymer or an anionic surfactant. In embodiments including a cationic polymer and an anionic polymer, the polymers may form a polyelectrolyte complex (although the disclosed embodiments are expressly not limited in this regard). While not wishing to be bound by theory, it is believed that a polyelectrolyte complex may provide improved colloidal stability of the anionic abrasive particles via providing stearic spacing that inhibits anionic particle agglomeration via interaction with the cationic polymer.

Notwithstanding the foregoing, the anionic polymer may include substantially any suitable anionic polymer or anionic surfactant having a negatively charged monomer or repeating negatively charged group. The anionic polymer may include, for example, an anionic homopolymer, an anionic copolymer including at least one anionic monomer (and an optional nonionic monomer), and combinations thereof.

For example suitable anionic polymers may include poly (acrylic acid) (PAA), poly(methacrylic acid) (PMAA), poly (maleic acid) (PMA), poly(vinyl sulfonic acid) (PVSA), poly(styrene sulfonic acid) (PSSA), poly(2-acrylamido-2-methylpropane sulfonic acid), poly(styrenesulfonic acid-co-maleic acid), poly(acrylic acid)-co-poly (2-acrylamido 2-methylpropane sulfonic acid) and mixtures thereof. It will be appreciated that the use of PAA, PMAA, and PMA may not always be suitable for use in compositions including certain of the iron containing accelerators described below.

In certain advantageous embodiments, the anionic polymer may include a polysulfonic acid polymer comprising sulfonic acid monomer units. Example polysulfonic acid polymers include PVSA, PSSA, poly(2-acrylamido-2-methylpropane sulfonic acid), poly(styrenesulfonic acid-co-maleic acid), and mixtures thereof. PVSA and PSSA are most preferred.

An anionic surfactant may include a long carbon chain alky sulfonate, for example, including 10 or more carbon atoms. Suitable anionic surfactants include anionic surfactants having a functional group that carries a negative charge in a desired pH working space (e.g. sulfonate and sulfate), and an alkyl group. Preferred anionic surfactants may have the negatively charged functional group accompanied by ether and/or phenol. The negatively charged functional group is preferably a sulfate group or a sulfonate group. Example suitable anionic surfactants include disodium hexadecyldiphenyloxide disulfonate, ammonium polyoxyethylene styrenated aryl sulfate, and ammonium alkyl polyoxethylene ether sulfate (such as ammonium polyoxyethylene oleyl cetyl ether sulfate, and ammonium lauryl polyoxyethylene ether sulfate).

It will of course be understood that where applicable the above described anionic polymers and anionic surfactants may be provided as the parent acids, or as conjugate base salts or mixtures thereof, including any reasonable positively charged counterions, such as sodium, potassium, or ammonium cations.

The polishing composition may include substantially any suitable amount of the anionic polymer or anionic surfactant at point of use. For example, the polishing composition may include 0.5 ppm by weight or more anionic polymer or anionic surfactant at point of use (e.g., about 1 ppm by weight or more, about 2 ppm by weight or more, about 5 ppm by weight or more, or about 10 ppm by weight or more). The amount of anionic polymer or anionic surfactant in the composition may be 2,000 ppm by weight or less at point of use (e.g., about 1000 ppm by weight or less, about 500 ppm by weight or less, about 200 ppm by weight or less, or about 100 ppm by weight or less). Accordingly, it will be understood that the amount of anionic polymer or anionic surfactant may be in a range bounded by any two of the aforementioned endpoints, for example, in a range from about 0.5 ppm by weight to about 2,000 ppm by weight at point of use (e.g., from about 1 ppm by weight to about 1000 ppm by weight, from about 5 ppm by weight to about 200 ppm by weight, or from about 10 ppm by weight to about 100 ppm by weight).

The disclosed polishing composition further includes a cationic polymer. The cationic polymer may include substantially any suitable cationic polymer, for example, a cationic homopolymer, a cationic copolymer including at least one cationic monomer (and an optional nonionic monomer), and combinations thereof. The cationic polymer may be advantageously selected, for example, to improve planarization efficiency or the final topography (e.g., as measured via line dishing and array erosion) of the polished wafer.

The cationic polymer may be substantially any suitable cationic homopolymer including cationic monomer repeat units, for example, including quaternary amine groups as repeat units. The quaternized amine groups may be acyclic or incorporated into a ring structure. Quaternized amine groups include tetrasubstituted nitrogen atoms substituted with four groups independently selected from alkyl, alkenyl, aryl, arylalkyl, acrylamido, or methacrylate groups. When included into a ring structure, quaternized amine groups include either a heterocyclic saturated ring including a nitrogen atom and are further substituted with two groups as described above or a heteroaryl group (e.g., imidazole or pyridine) having a further group as described above bonded to the nitrogen atom. Quaternized amine groups possess a positive charge (i.e., are cations having associated anionic moieties, thereby forming salts). It is also suitable for the cationic polymer to be further modified by alkylation, acylation, ethoxylation, or other chemical reaction, in order to alter the solubility, viscosity, or other physical parameter of the cationic polymer. Suitable quaternary amine monomers include, for example, quaternized vinylimidazole (vinylimidazolium), methacryloyloxyethyltrimethylammonium (MADQUAT), diallyldimethylammonium (DADMA), methacrylamidopropyl trimethylammonium (MAPTA), quaternized dimethylaminoethyl methacrylate (DMAEMA), epichlorohydrin-dimethylamine (epi-DMA), quaternized poly(vinyl alcohol) (PVOH), quaternized hydroxyethylcellulose, and combinations thereof. It will be appreciated that MADQUAT, DADMA, MAPTA, and DMAEMA commonly include a counter anion such as a carboxylate (e.g., acetate) or a halide anion (e.g., chloride). The disclosed embodiments are not limited in this regard.

The cationic polymer may also be a copolymer including at least one cationic monomer (e.g., as described in the preceding paragraph) and at least one nonionic monomer. Non-limiting examples of suitable nonionic monomers include vinylpyrrolidone, vinylcaprolactam, vinylimidazole, acrylamide, vinyl alcohol, polyvinyl formal, polyvinyl butyral, poly(vinyl phenyl ketone), vinylpyridine, polyacrolein, cellulose, hydroxylethyl cellulose, ethylene, propylene, styrene, and combinations thereof.

Example cationic polymers include but are not limited to poly(vinylimidazolium), polyethyleneimine, poly(methacryloyloxyethyltrimethylammonium) (polyMADQUAT), poly(diallyldimethylammonium) chloride (e.g., polyDADMAC) (i.e., Polyquaternium-6), poly(dimethylamine-co-epichlorohydrin), poly[bis(2-chloroethyl) ether-alt-1,3-bis[3-(dimethylamino)propyl]urea] (i.e., Polyquaternium-2), copolymers of hydroxyethyl cellulose and diallyldimethylammonium (i.e., Polyquaternium-4), copolymers of acrylamide and diallyldimethylammonium (i.e., Polyquaternium-7), quaternized hydroxyethylcellulose ethoxylate (i.e., Polyquaternium-10), copolymers of vinylpyrrolidone and quaternized dimethylaminoethyl methacrylate (i.e., Polyquaternium-11), copolymers of vinylpyrrolidone and quaternized vinylimidazole (i.e., Polyquaternium-16), Polyquaternium-24, a terpolymer of vinylcaprolactam, vinylpyrrolidone, and quaternized vinylimidazole (i.e., Polyquaternium-46), 3-Methyl-1-vinylimidazolium methyl sulfate-N-vinylpyrrolidone copolymer (i.e., Polyquaternium-44), and copolymers of vinylpyrrolidone and diallyldimethylammonium. Additionally, suitable cationic polymers include cationic polymers for personal care such as Luviquat® Supreme, Luviquat® Hold, Luviquat® UltraCare, Luviquat® FC 370, Luviquat® FC 550, Luviquat® FC 552, Luviquat® Excellence, GOHSEFIMER K210™, GOHSENX K-434, and combinations thereof. In certain example embodiments, poly(diallyldimethylammonium) chloride (e.g., polyDADMAC) is a preferred cationic polymer.

In certain embodiments, the cationic polymer may include a repeating amino acid monomer (such compounds may also be referred to as polyamino acid compounds). Suitable polyamino acid compounds may include substantially any suitable amino acid monomer groups, for example, including polyarginine, polyhistidine, polyalanine, polyglycine, polytyrosine, polyproline, polyornithine and polylysine. In certain example embodiments, polylysine is a preferred polyamino acid and a preferred cationic polymer. It will be understood that polylysine may include ε-polylysine and/or α-polylysine composed of D-lysine and/or L-lysine. The polylysine may thus include α-poly-L-lysine, α-poly-D-lysine, ε-poly-L-lysine, ε-poly-D-lysine, and mixtures thereof. In certain embodiments, the polylysine may be primarily ε-poly-L-lysine. It will further be understood that the polyamino acid compound (or compounds) may be used in any accessible form, e.g., the conjugate acid or base and salt forms of the polyamino acid may be used instead of (or in addition to) the polyamino acid.

The cationic polymer may also (or alternatively) include a derivatized polyamino acid (i.e., a cationic polymer containing a derivatized amino acid monomer unit). For example, the derivatized polyamino acid may include derivatized polyarginine, derivatized polyornithine, derivatized polyhistidine, and derivatized polylysine. CMP compositions including derivatized polyamino acid compounds are disclosed in U.S. Provisional Patent Application Ser. No. 62/958,033, which is incorporated by reference herein in its entirety.

The polishing composition may include substantially any suitable amount of the cationic polymer at point of use. For example, the polishing composition may include 0.1 ppm by weight or more cationic polymer at point of use (e.g., about 0.2 ppm by weight or more, about 0.3 ppm by weight or more, about 0.5 ppm by weight or more, about 1 ppm by weight or more, 2 ppm by weight or more, 5 ppm by weight or more, 10 ppm by weight or more, 20 ppm by weight or more, or about 30 ppm by weight or more). The amount of cationic polymer in the composition may be 200 ppm by weight or less at point of use (e.g., about 100 ppm by weight or less, about 75 ppm by weight or less, about 50 ppm by weight or less, or about 25 ppm by weight or less). Accordingly, it will be understood that the amount of cationic polymer may be in a range bounded by any two of the aforementioned endpoints, for example, in a range from about 0.1 ppm by weight to about 200 ppm by weight at point of use (e.g., from about 1 ppm by weight to about 200 ppm by weight, from about 2 ppm by weight to about 50 ppm by weight, or from about 20 ppm by weight to about 200 ppm by weight) depending on the particular cationic polymer used.

In certain advantageous embodiments the anionic polymer may include a polysulfonic acid polymer and the cationic polymer may include a polyamino acid or a repeating monomer having a quaternary amine group. In one particularly preferred embodiment the anionic polymer includes polystyrenesulfonic acid (PSSA) and the cationic polymer comprises polylysine (e.g., ε-poly-L-lysine).

The anionic and cationic polymers may have substantially any suitable molecular weights and need not have the same molecular weight or even similar molecular weights. For example, the anionic and cationic polymers may have an average molecular weight of about 200 g/mol or more (e.g., about 1,000 g/mol or more, about 3,000 g/mol or more, or about 10,000 g/mol or more). The anionic and cationic polymers may have an average molecular weight of about 5,000,000 g/mol or less (e.g., about 1,000,000 g/mol or less, about 300,000 or about 100,000 g/mol or less). Accordingly, it will be understood that the anionic and cationic polymers may have an average molecular weight bounded by any two of the aforementioned endpoints. For example, the cationic polymer may have an average molecular weight from about 200 g/mol to about 5,000,000 g/mol (e.g., from about 1,000 g/mol to about 1,000,000 g/mol or from about 3,000 g/mol to about 300,000 g/mol).

In certain advantageous embodiments, the polishing compositions may include a preferred ratio of the amount of anionic polymer or anionic surfactant to the amount of cationic polymer. This ratio may be expressed, for example, as a negative to positive charge ratio in which the negative to positive charge ratio of the composition is a ratio of the total number of negative charges on the anionic polymer or anionic surfactant to the total number of positive charges on the cationic polymer (e.g., in moles of charge per liter of composition). It will be understood that while the anionic particles (e.g., the anionic silica or anionic alumina abrasive particles) have negative charges associated therewith, these negative charges are not included when computing the negative to positive charge ratio of the composition.

In preferred embodiments, the total number of negative charges on the anionic polymer or anionic surfactant is greater than or equal to the total number of positive charges on the cationic polymer (i.e., a negative to positive charge ratio greater than or equal to 1:1). As described in more detail below in the Examples, it has been found that the colloidal stability of anionic silica particles tends to decrease significantly when the negative to positive charge ratio of the composition is less than 1:1 (i.e., when the number of positive charges on the cationic polymer exceeds the number of negative charges on the anionic polymer or anionic surfactant). The colloidal stability of anionic alumina particles tends to decrease significantly when the negative to positive charge ratio of the composition is less than about 3.5:1. At higher negative to positive charge ratios (e.g., at negative to positive charge ratios exceeding 20:1 or more), the polishing performance may be adversely affected. For example, the removal rate a TiN barrier layer may decrease with increasing amounts of the anionic polymer thereby increasing wafer processing time and potentially increasing dishing and/or erosion in patterned wafers. The static etch rate of tungsten may also increase at higher anionic polymer levels.

As described above, the polishing composition (particularly polishing compositions including anionic colloidal silica) may include a negative to positive charge ratio of 1:1 or more (e.g., 1.2:1 or more or 1.5:1 or more). The polishing composition may also include a negative to positive charge ratio of 20:1 or less (e.g., about 15:1 or less, about 12:1 or less, or about 10:1 or less). Accordingly, it will be understood that the polishing composition may include a negative to positive charge ratio bounded by any two of the aforementioned endpoints. For example, the negative to positive charge ratio may be in a range from about 1:1 to about 20:1 (e.g., from about 1:1 to about 12:1 or from about 1:1 to about 10:1).

Polishing compositions including anionic alpha alumina particles may include a negative to positive charge ratio of 3.5:1 or more (e.g., 4:1 or more). The polishing composition may also include a negative to positive charge ratio of 20:1 or less (e.g., about 15:1 or less, about 12:1 or less, or about 10:1 or less). Accordingly, it will be understood that the polishing composition may include a negative to positive charge ratio bounded by any two of the aforementioned endpoints. For example, the negative to positive charge ratio may be in a range from about 3.5:1 to about 20:1 (e.g., from about 3.5:1 to about 12:1 or from about 3.5:1 to about 10:1).

It will be understood that the charge (negative or positive) on a soluble polymer may be the result of a permanently charged group and/or an ionizable group. It will be further understood that the number of charges from permanently charged groups is essentially independent of pH, while the number of charges from ionizable groups depends on pH (and the $pK_a$ of the ionizable group). Based upon the Henderson-Hasselbach equation which defines the $pK_a$ as the pH at which 50 percent of the ionizable groups are ionized, the number of negative charges in the composition (from the anionic polymer or anionic surfactant) may be expressed mathematically, for example, as follows $$N^- = P^- + I^- \cdot \frac{10^{(pH-pK_a)}}{1 + 10^{(pH-pK_a)}} \quad (1)$$

where $N^-$ represents the number of negative charges, $P^-$ represents the number of negative permanently charged groups, $I^-$ represents the number of negative ionizable groups, pH represents the pH of the composition, and $pK_a$ represents the $pK_a$ of the ionizable group. Likewise, the number of positive charges in a composition (from the cationic polymer) may be expressed mathematically, for example, as follows:

$$N^+ = P^+ + I^+ \cdot \frac{10^{(pK_a-pH)}}{1 + 10^{(pK_a-pH)}} \quad (2)$$

where $N^+$ represents the number of positive charges, $P^+$ represents the number of positive permanently charged groups, $I^+$ represents the number of positive ionizable groups, pH represents the pH of the composition, $pK_a$ represents the $pK_a$ of the ionizable group. It will be understood based on the foregoing nomenclature that the negative to positive charge ratio of the composition may defined as the ratio of $N^-$ to $N^+$.

Computation of the negative to positive charge ratio of a composition is now demonstrated via the following non-limiting example including 110 ppm by weight poly(4-styrene sulfonic acid) (the anionic polymer) and 25 ppm by weight polylysine (the cationic polymer) at a pH of 2.3. In this example, the anionic polymer has an average molecular weight of about 75,000 g/mol and the cationic polymer has an average molecular weight of about 4,000 g/mol. The anionic polymer therefore includes about 407 repeating monomer units (on average), each having a molecular weight of about 184 g/mol. The cationic polymer therefore includes about 31 repeating monomer units (on average), each having a molecular weight of about 129 g/mol.

The number of negative charges $N^-$ may be computed according to Equation 1 where $I^-=0$ for poly(4-styrene sulfonic acid) such that $N^-=P^-$. As will be readily apparent to one of ordinary skill, poly(4-styrene sulfonic acid) includes one negative permanently charged group per monomer such that $P^-$ equals the number of monomer groups (or the concentration of monomer groups). Therefore:

$$N^- = P^- = \frac{0.110 \text{ g}}{l} \cdot \frac{\text{mol}}{184 \text{ g}} = \frac{5.98 \times 10^{-4} \text{ mol}}{l}$$

The number of positive charges $N^+$ may be computed according to Equation 2 where polylysine includes one positive permanently charged group and one positive ionizable group per monomer. $P^+$ and $I^+$ can be computed as above as follows:

$$P^+ = I^+ = \frac{0.025 \text{ g}}{l} \cdot \frac{\text{mol}}{129 \text{ g}} = \frac{1.94 \times 10^{-4} \text{ mol}}{l}$$

Those of ordinary skill in the art will readily appreciate that the positive ionizable group in polylysine has a $pK_a=2.18$ such that (following Equation 2):

$$N^+ = \frac{1.94 \times 10^{-4} \text{ mol}}{l} + \frac{1.94 \times 10^{-4} \text{ mol}}{l} \cdot \frac{10^{(2.18-2.3)}}{1 + 10^{(2.18-2.3)}} = \frac{2.78 \times 10^{-4} \text{ mol}}{l}$$

The negative to positive charge ratio of this example composition is therefore: $N^-/N^+=2.15$ (i.e., 2.15:1).

The disclosed polishing compositions are generally acidic, having a pH of less than about 7. For example, the pH may be greater than about 1 (e.g., greater than about 1.5 or greater than about 2, or greater than about 2.5). The pH may be less than about 6 (e.g., less than about 5, less than about 4, or less than about 3). Accordingly, it will be understood that the pH of the polishing composition may be bounded by any of the aforementioned endpoints, for example, in a range from about 1 to about 6 (e.g., from about 1 to about 5, from about 2 to about 5, or from about 2 to about 4). In part to minimize safety and shipping concerns, the pH is preferably greater than about 2.

The pH of the polishing composition may be achieved and/or maintained by any suitable means. The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, and the like while suitable buffering agents may include phosphates, sulfates, acetates, malonates, oxalates, borates, ammonium salts, and the like.

The disclosed compositions further may optionally further include an iron-containing tungsten (or molybdenum) polishing accelerator and a corresponding stabilizer (for embodiments configured for tungsten or molybdenum polishing). An iron-containing accelerator as used herein is an iron-containing chemical compound that increases the removal rate of tungsten during a tungsten CMP operation. For example, the iron-containing accelerator may include a soluble iron-containing catalyst such as is disclosed in U.S. Pat. Nos. 5,958,288 and 5,980,775. Such an iron-containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, carboxylic acids, acetylacetonates, citrates, gluconates, malonates, oxalates, phthalates, and succinates, and mixtures thereof.

An iron-containing accelerator may also include an iron-containing activator (e.g., a free radical producing compound) or an iron-containing catalyst associated with (e.g., coated or bonded to) the surface of the colloidal silica particle such as is disclosed in U.S. Pat. Nos. 7,029,508 and 7,077,880. For example, the iron-containing accelerator may be bonded with the silanol groups on the surface of the colloidal surface particles.

The amount of iron-containing accelerator in the polishing composition may be varied depending upon the oxidizing agent used and the chemical form of the accelerator. When the oxidizing agent (described in more detail below) is hydrogen peroxide (or one of its analogs) and a soluble iron-containing catalyst is used (such as ferric nitrate or hydrates of ferric nitrate), the catalyst may be present in the composition at point of use in an amount sufficient to provide a range from about 0.5 to about 3000 ppm Fe based on the total weight of the composition. The polishing composition may include about 1 ppm Fe or more at point of use (e.g., about 2 ppm or more, about 5 ppm or more, or about 10 ppm or more). The polishing composition may include about 1000 ppm Fe or less at point of use (e.g., about 500 ppm or less, about 200 ppm or less, or about 100 ppm or less). Accordingly, the polishing composition may include Fe in a range bounded by any one of the above endpoints. The composition may include from about 1 to about 1000 ppm Fe at point of use (e.g., from about 2 to about 500 ppm, from about 5 to about 200 ppm, or from about 10 to about 100 ppm).

Embodiments of the polishing composition including an iron-containing accelerator may further include a stabilizer. Without such a stabilizer, the iron-containing accelerator and the oxidizing agent, if present, may react in a manner that degrades the oxidizing agent rapidly over time. The addition of a stabilizer tends to reduce the effectiveness of the iron-containing accelerator such that the choice of the type and amount of stabilizer added to the polishing composition may have a significant impact on CMP performance. The addition of a stabilizer may lead to the formation of a stabilizer/accelerator complex that inhibits the accelerator from reacting with the oxidizing agent, if present, while at the same time allowing the accelerator to remain sufficiently active so as to promote rapid tungsten polishing rates.

Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. The term "acid" as it is used herein to describe useful stabilizers also means the conjugate base of the acid stabilizer. Stabilizers can be used alone or in combination and significantly reduce the rate at which oxidizing agents such as hydrogen peroxide decompose.

Preferred stabilizers include phosphoric acid, acetic acid, phthalic acid, citric acid, adipic acid, oxalic acid, malonic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. The preferred stabilizers may be added to the compositions of this invention in an amount ranging from about 1 equivalent per iron-containing accelerator to about 3.0 weight percent or more (e.g., from about 3 to about 10 equivalents). As used herein, the term "equivalent per iron-containing accelerator" means one molecule of stabilizer per iron ion in the composition. For example, 2 equivalents per iron-containing accelerator means two molecules of stabilizer for each catalyst ion.

The polishing composition may optionally further include an oxidizing agent. The oxidizing agent may be added to the polishing composition during the slurry manufacturing process or just prior to the CMP operation (e.g., in a tank or slurry distribution system located at the semiconductor fabrication facility as in common in the industry). Preferable oxidizing agents include inorganic or organic per-compounds. A per-compound as defined herein is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($S_2O_8^=$), and sodium peroxide. Examples of compounds containing an element in its highest oxidation state include but are not limited to periodic acid, periodate salts, perbromic acid, perbromate salts, perchloric acid, perchlorate salts, perboric acid, and perborate salts and permanganates. The most preferred oxidizing agent is hydrogen peroxide.

The oxidizing agent may be present in the polishing composition in an amount ranging, for example, from about 0.1 to about 20 wt. % at point of use. For example, in embodiments in which a hydrogen peroxide oxidizer and a soluble iron-containing accelerator are used, the oxidizer may be present in the polishing composition in an amount ranging from about 0.1 wt. % to about 10 wt. % at point of use (e.g., from about 0.5 wt. % to about 5 wt. % or from about 1 wt. % to about 5 wt. %).

The disclosed polishing composition may further optionally include a compound that inhibits (or further inhibits) metal etching (e.g., tungsten or molybdenum etching/corrosion). Suitable inhibitor compounds are intended to inhibit the conversion of solid metal into soluble metal compounds while at the same time allowing for effective removal of solid metal via the CMP operation. The polishing composition may include substantially any suitable inhibitor, for example, inhibitor compounds disclosed in commonly assigned U.S. Pat. Nos. 9,238,754; 9,303,188; and 9,303,189.

Example classes of compounds that that are useful inhibitors of metal (e.g., tungsten) etching include compounds having nitrogen containing functional groups such as nitrogen containing heterocycles, alkyl ammonium ions, amino alkyls, and amino acids. Useful amino alkyl corrosion inhibitors include, for example, hexylamine, tetramethyl-p-phenylene diamine, octylamine, diethylene triamine, dibutyl benzylamine, aminopropylsilanol, aminopropylsiloxane, dodecylamine, mixtures thereof, and synthetic and naturally occurring amino acids including, for example, lysine, tyrosine, glutamine, glutamic acid, cystine, and glycine (aminoacetic acid).

The inhibitor compound may alternatively and/or additionally include an amine compound in solution in the liquid carrier. The amine compound (or compounds) may include a primary amine, a secondary amine, a tertiary amine, or a quaternary amine. The amine compound may further include a monoamine, a diamine, a triamine, a tetramine, or an amine based polymer having a large number of repeating amine groups (e.g., 4 or more amine groups).

The disclosed polishing compositions may include substantially any suitable concentration of the tungsten etch inhibitor compound. In general the concentration is desirably high enough to provide adequate etch inhibition at a range of oxidizer (e.g., hydrogen peroxide) concentrations, but low enough so that the compound is soluble and does not reduce tungsten polishing rates below acceptable levels. By soluble it is meant that the compound is fully dissolved in the liquid carrier or that it forms micelles in the liquid carrier or is carried in micelles. In certain embodiments the concentration of inhibitor may be in a range from about 0 ppm by weight to about 10,000 ppm by weight at point of use (e.g., from about 0 ppm by weight to about 5000 ppm by weight or from about 0 ppm by weight to about 1000 ppm by weight).

Disclosed polishing compositions may include substantially any additional optional chemical additives. For example, the disclosed compositions may include still further etch inhibitors, dispersants, and biocides. Such additional additives are purely optional. The disclosed embodiments are not so limited and do not require the use of any one or more of such additives. In embodiments further including a biocide, the biocide may include any suitable biocide, for example an isothiazolinone biocide known to those of ordinary skill in the art.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the colloidal silica, the iron-containing accelerator, the amine compound, etc.).

For example, the polishing composition components (such as the iron-containing accelerator, the stabilizer, the tungsten etch inhibitor, and/or the biocide) may be added directly to a silica dispersion (such as an anionic or cationic colloidal silica). The silica dispersion and the other components may be blended together using any suitable techniques for achieving adequate mixing. Such blending/mixing techniques are well known to those of ordinary skill in the art. The oxidizing agent, when present, may be added at any time during the preparation of the polishing composition. For example, the polishing composition may be prepared prior to use, with one or more components, such as the oxidizing agent, being added just prior to the CMP operation (e.g., within about 1 minute, or within about 10 minutes, or within about 1 hour, or within about 1 day, or within about 1 week of the CMP operation). The polishing composition also may also be prepared by mixing the components at the surface of the substrate (e.g., on the polishing pad) during the CMP operation.

The polishing composition may advantageously be supplied as a one-package system comprising a colloidal silica having the above-described physical properties and other optional components. An oxidizing agent may be desirably supplied separately from the other components of the polishing composition and may be combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Various other two-container, or three- or more-container, combinations of the components of the polishing composition are within the knowledge of one of ordinary skill in the art.

The polishing composition of the invention may also be provided as a concentrate which is intended to be diluted with an appropriate amount of water prior to use. In such an embodiment, the polishing composition concentrate may include the abrasive (e.g., silica), the iron-containing accelerator, the stabilizer, the tungsten etch inhibitor, and an optional biocide in amounts such that, upon dilution of the concentrate with an appropriate amount of water, and an optional oxidizing agent if not already present in an appropriate amount, each component of the polishing composition will be present in the polishing composition in an amount within the appropriate ranges recited above for each component. For example, the colloidal silica and other optional components may each be present in the polishing composition in an amount that is about 2 times (e.g., about 3 times, about 4 times, about 5 times, or even about 10 times) greater than the point of use concentrations recited above for each component so that, when the concentrate is diluted with an equal volume of (e.g., 2 equal volumes of water, 3 equal volumes of water, 4 equal volumes of water, or even 9 equal volumes of water respectively), along with the oxidizing agent in a suitable amount, each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

The disclosed polishing compositions may be advantageously used to polish a substrate including a tungsten layer or a molybdenum layer and a dielectric material such as silicon oxide. In such applications, the tungsten or molybdenum layer may be deposited over one or more barrier layers, for example, including titanium and/or titanium nitride (TiN). The dielectric layer may be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as tungsten, titanium, titanium nitride, and/or a dielectric material as described herein) to polish the substrate.

A substrate may be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

It will be understood that the disclosure includes numerous embodiments. These embodiments include, but are not limited to the embodiment listed in the claims.

In a first embodiment a chemical mechanical polishing composition comprises a liquid carrier; anionic particles dispersed in the liquid carrier; a cationic polymer; and an anionic polymer or an anionic surfactant.

A second embodiment may include the first embodiment wherein the anionic particles comprise anionic silica, anionic alumina, or a mixture thereof.

A third embodiment may include any one of the first through second embodiments, further comprising: an iron-containing accelerator; and a stabilizer bound to the iron-containing accelerator.

A fourth embodiment may include any one of the first through third embodiments, further comprising hydrogen peroxide.

A fifth embodiment may include any one of the first through fourth embodiments, wherein a ratio of a total number of negative charges on the anionic polymer to a total number of positive charges on the cationic polymer at a pH of the composition is greater than about 1:1.

A sixth embodiment may include any one of the first through fifth embodiments, wherein a ratio of a total number of negative charges on the anionic polymer to a total number of positive charges on the cationic polymer is in a range from about 1:1 to about 10:1.

A seventh embodiment may include any one of the first through sixth embodiments, wherein the anionic particles comprise anionic colloidal silica particles; and a ratio of a total number of negative charges on the anionic polymer to a total number of positive charges on the cationic polymer at a pH of the composition is greater than about 1:1.

An eighth embodiment may include any one of the first through fourth embodiments, wherein: the anionic particles comprise anionic alpha alumina particles; and a ratio of a total number of negative charges on the anionic polymer to a total number of positive charges on the cationic polymer at a pH of the composition is greater than about 3.5.

A ninth embodiment may include any one of the first through eighth embodiments, wherein the anionic polymer comprises a polysulfonic acid polymer.

A tenth embodiment may include any one of the first through ninth embodiments, wherein the anionic polymer is a polysulfonic acid polymer comprising sulfonic acid monomer units, the polysulfonic acid polymer selected from the group consisting of polyvinylsulfonic acid, polystyrenesulfonic acid, poly(2-acrylamido-2-methylpropane sulfonic acid), poly(styrenesulfonic acid-co-maleic acid), and mixtures thereof.

An eleventh embodiment may include any one of the first through tenth embodiments, wherein the anionic polymer comprises polyvinylsulfonic acid, polystyrenesulfonic acid, or mixtures thereof.

A twelfth embodiment may include any one of the first through eleventh embodiments, wherein the cationic polymer comprises a polyamino acid.

A thirteenth embodiment may include any one of the first through twelfth embodiments, wherein the cationic polymer comprises polylysine.

A fourteenth embodiment may include any one of the first through eleventh embodiments, wherein the cationic polymer comprises a monomer including a quaternary amine group.

A fifteenth embodiment may include the fourteenth embodiment, wherein the cationic polymer comprises poly(diallyldimethylammonium).

A sixteenth embodiment may include any one of the first through sixth embodiments, wherein: the anionic particles comprise anionic silica; the anionic polymer comprises a polysulfonic acid polymer; and the cationic polymer comprises a polyamino acid.

A seventeenth embodiment may include the sixteenth embodiment, wherein: the composition further comprises an iron-containing accelerator and a stabilizer bound to the iron-containing accelerator; the cationic polymer comprises polylysine; and a ratio of a total number of negative charges on the anionic polymer to a total number of positive charges on the cationic polymer is in a range from about 1:1 to about 20:1.

An eighteenth embodiment may include the seventeenth embodiment, wherein: the composition comprises from about 20 to about 2000 ppm by weight of polystyrenesulfonic acid at point of use; and the composition comprises from about 2 to about 50 ppm by weight of the polylysine at point of use.

A nineteenth embodiment may include any one of the first through sixth embodiments, wherein: the anionic particles comprise anionic alpha alumina; the anionic polymer comprises a polysulfonic acid polymer; and the cationic polymer comprises a monomer including a quaternary amine group.

A twentieth embodiment may include the nineteenth embodiment, wherein: the composition further comprises an iron-containing accelerator and a stabilizer bound to the iron-containing accelerator; the cationic polymer comprises poly(diallyldimethylammonium); and a ratio of a total number of negative charges on the anionic polymer to a total number of positive charges on the cationic polymer is in a range from about 3.5:1 to about 20:1.

A twenty-first embodiment may include the twentieth embodiment, wherein: the composition comprises from about 20 to about 2000 ppm by weight of polystyrenesulfonic acid at point of use; and the composition comprises from about 20 to about 200 ppm by weight of the poly(diallyldimethylammonium) at point of use.

A twenty-second embodiment may include any one of the first through twenty-first embodiments, wherein the anionic particles have a negative charge of at least 10 mV in the polishing composition.

A twenty-third embodiment may include any one of the first through twenty-second embodiments, comprising less than about 1 weight percent of the anionic particles at point of use.

A twenty-fourth embodiment may include any one of the first through twenty-third embodiments, having a pH in a range from about 2 to about 5.

In a twenty-fifth embodiment a method of chemical mechanical polishing a substrate having a tungsten layer or a molybdenum layer comprises (a) contacting the substrate with a polishing composition including: a liquid carrier, anionic particles dispersed in the liquid carrier, a cationic polymer, and an anionic polymer or an anionic surfactant; (b) moving the polishing composition relative to the substrate; and (c) abrading the substrate to remove a portion of the tungsten layer or the molybdenum layer from the substrate and thereby polish the substrate.

A twenty-sixth embodiment may include the twenty-fifth embodiment, wherein: the anionic particles comprise anionic silica; the anionic polymer comprises a polysulfonic acid polymer; and the cationic polymer comprises a polyamino acid.

A twenty-seventh embodiment may include the twenty-sixth embodiment, wherein: the polishing composition further comprises an iron-containing accelerator and a stabilizer bound to the iron-containing accelerator; the cationic polymer comprises polylysine and a ratio of a total number of negative charges on the anionic polymer to a total number of positive charges on the cationic polymer is in a range from about 1:1 to about 20:1.

A twenty-eighth embodiment may include the twenty-fifth embodiment, wherein: the anionic particles comprise anionic alpha alumina; the anionic polymer comprises a polysulfonic acid polymer; and the cationic polymer comprises a monomer including a quaternary amine group.

A twenty-ninth embodiment may include the twenty-eighth embodiment, wherein: the polishing composition further comprises an iron-containing accelerator and a stabilizer bound to the iron-containing accelerator; the cationic polymer comprises poly(diallyldimethylammonium); and a ratio of a total number of negative charges on the anionic polymer to a total number of positive charges on the cationic polymer is in a range from about 3.5:1 to about 20:1.

The following examples further illustrate the invention but, of course, should not be construed as in any way limiting its scope.

Example 1

Seven polishing compositions were prepared and evaluated. Each composition included 1.2 weight percent anionic colloidal silica having an average particle size of about 100 nm (PL-5D available from Fuso Chemical Company). Each composition further included 8000 ppm by weight malonic acid, 4725 ppm by weight ferric nitrate nonahydrate, 25 ppm by weight ε-poly-L-lysine having an average molecular weight of 4000 g/mol (the cationic polymer in this example), 30 ppm by weight benzotriazole, and 100 ppm by weight Proxel Ultra10 biocide. The pH of each composition was adjusted to 2.0 using nitric acid. Composition 1A included no further components. Compositions 1B, 1C, 1D, 1E, 1F, and 1G further included poly(styrene sulfonic acid) (the anionic polymer in this example) having an average molecular weight of 75,000 g/mol as follows: 45 ppm by weight (1B), 108.75 ppm by weight (1C), 172.5 ppm by weight (1D), 236.25 ppm by weight (1E), 300 ppm by weight (1F), and 600 ppm by weight (1G). Table 1 lists the ratio of the total number of negative charges on the anionic polymer to the total number of positive charges on the cationic polymer at pH 2 as calculated using Equations 1 and 2 above.

Two samples of each composition were aged at 45 degrees C. to evaluate the colloidal stability of the anionic silica in the presence of the other components in the composition. The particle size of the anionic colloidal silica in each sample was measured using a Zetasizer® available from Malvern® Instruments. The particle size measurements were made at 0, 1, 2, 3, and 4 weeks of aging at 45 degrees C. (the zero week measurement was made soon after the sample temperature reached 45 degrees C.). Table 1 reports the average particle size value of the two samples for each composition. The differences between particle size values for the two samples were generally within one nm and never exceeded 3 nm.

TABLE 1

| Polishing Composition | (−)/(+) Ratio | Aged Particle Size (nm) | | | | |
|---|---|---|---|---|---|---|
| | | 0 week | 1 week | 2 week | 3 week | 4 week |
| 1A | 0 | Settled | Settled | Settled | Settled | Settled |
| 1B | 0.79 | 112.3 | 112.0 | 112.2 | 112.4 | 112.4 |
| 1C | 1.9 | 103.8 | 103.4 | 103.5 | 103.4 | 103.4 |
| 1D | 3.0 | 101.8 | 102.5 | 102.4 | 102.3 | 102.4 |
| 1E | 4.1 | 102.0 | 101.9 | 101.8 | 101.8 | 101.9 |
| 1F | 5.3 | 101.1 | 101.4 | 101.6 | 101.4 | 101.3 |
| 1G | 10.5 | 101.8 | 102.5 | 102.5 | 101.4 | 101.4 |

As is apparent from the results set forth in Table 1, polishing compositions 1C, 1D, 1E, 1F, and 1G were colloidally stable and did not exhibit particle growth. Composition 1B was colloidally stable, but exhibited an increase in particle size of about 10 nm. Composition 1A was unstable and settled rapidly (upon adding the cationic polymer to the anionic silica dispersion). It is evident from this example that the compositions having a negative to positive charge ratio of less than 1 (1A and 1B) had a poor colloidal stability as compared to the compositions having a negative to positive charge ratio of greater than 1 (1C, 1D, 1E, 1F, and 1G).

Example 2

Twelve polishing compositions were prepared and evaluated. Each composition included 1.5 weight percent anionic colloidal silica having an average particle size of about 100 nm (PL-5D available from Fuso Chemical Company). Each composition further included 8000 ppm by weight malonic acid, 4725 ppm by weight ferric nitrate nonahydrate, 30 ppm by weight benzotriazole, 15 ppm by weight Acticide® 14 biocide, and poly(styrene sulfonic acid) having an average molecular weight of 75,000 g/mol. The pH of each composition was adjusted to 2.0 using nitric acid. Compositions 2A, 2C, 2E, 2G, 2I, and 2K included 84 ppm by weight PSSA while compositions 2B, 2D, 2F, 2H, 2J, and 2L included 140 ppm by weight PSSA. Compositions 2C-2L further included 25 ppm by weight (2C and 2D), 40 ppm by weight (2E and 2F), 50 ppm by weight (2G and 2H), 75 ppm by weight (2I and 2J), or 100 ppm by weight (2K and 2L) ε-poly-L-lysine having an average molecular weight of 4000 g/mol. The amounts of PSSA and EPLL are indicated in Table 4 along with the ratio of the total number of negative charges on the anionic polymer to the total number of total number of positive charges on the cationic polymer at pH 2 as calculated using Equations 1 and 2 above.

The particle size of the anionic colloidal silica in each sample was measured using a Zetasizer® available from Malvern® Instruments. Table 2 reports the average particle size value of the two samples for each composition. The static etch rate (SER) of tungsten was evaluated for compositions 2A-2H and 2J. Each composition further included 2 weight percent hydrogen peroxide. One inch square wafer samples (cleaved from 8 inch diameter blanket wafers) were submersed in the respective compositions (tungsten side up) for 3 minutes at 60 degrees C. The blanket wafers (from which the samples were cleaved) were first polished using W8700-105 (commercially available from CMC Materials) to remove incoming W roughness and tungsten oxides from the wafer surface. The SER values are reported in Table 2. Each SER value is the average of two measurements.

TABLE 2

| Polishing Composition | PSSA (ppm) | εPLL (ppm) | (−)/(+) Ratio | Size (nm) | SER (Å/min) |
|---|---|---|---|---|---|
| 2A | 84 | 0 | | 100 | 184 |
| 2B | 140 | 0 | | 95 | 177 |
| 2C | 84 | 25 | 1.5 | 101 | 139 |
| 2D | 140 | 25 | 2.5 | 95 | 124 |
| 2E | 84 | 40 | 0.92 | 98 | 137 |
| 2F | 140 | 40 | 1.5 | 98 | 87 |
| 2G | 84 | 50 | 0.74 | 110 | 152 |
| 2H | 140 | 50 | 1.2 | 94 | 107 |
| 2I | 84 | 75 | 0.49 | 343 | |
| 2J | 140 | 75 | 0.82 | 116 | 162 |
| 2K | 84 | 100 | 0.37 | 90100 | |
| 2L | 140 | 100 | 0.61 | 2662 | |

As is evident from the results set forth in Table 2, polishing compositions 2A-2F and 2H were colloidally stable and exhibited little to no particle growth. Polishing compositions 2G and 2J were initially stable but exhibited moderate particle growth, while compositions 2I, 2K, and 2L were unstable and exhibited rapid particle growth. Compositions including moderate levels of EPLL (e.g., 25, 40, and 50 ppm) exhibited lower SER values provided that the negative to positive charge ratio was greater than about 1 (e.g., compositions 2D, 2F, and 2H).

Example 3

Six polishing compositions were prepared and evaluated. Each composition included 1.5 weight percent anionic colloidal silica having an average particle size of about 100 nm (PL-5D available from Fuso Chemical Company). Each composition further included 8000 ppm by weight malonic acid, 4725 ppm by weight ferric nitrate nonahydrate, 30 ppm by weight benzotriazole, 100 ppm by weight Proxel Ultra10 biocide, 25 ppm by weight cationic polymer, and an anionic polymer or anionic surfactant. The pH of each composition was adjusted to 2.0 using nitric acid. Table 3A shows the particular cationic polymer and anionic polymer or surfactant used in these compositions. The amounts are given in parts per million by weight. Table 3A further lists the ratio of the total number of negative charges on the anionic polymer to the total number of total number of positive charges on the cationic polymer at pH 2 as calculated using Equations 1 and 2 above.

TABLE 3A

| Polishing Composition | Cationic Polymer | Anionic Polymer/ Surfactant (ppm) | (−)/(+) Ratio |
|---|---|---|---|
| 3A | 25 ppm ε-poly-L-lysine | 2250 ppm DDHDD | 8 |
| 3B | 25 ppm ε-poly-L-lysine | 562.5 ppm Z2300 | 2.8 |
| 3C | 25 ppm ε-poly-L-lysine | 280 ppm DDBSA | 2.8 |
| 3D | 25 ppm PEI (300) | 140 ppm PSSA | 1.3 |
| 3E | 25 ppm PEI (600) | 140 ppm PSSA | 1.3 |
| 3F | 25 ppm PEI (1800) | 140 ppm PSSA | 1.3 |

With reference to Table 3A PEI represents polyethyleneimine with average molecular weights of 300 (3D), 600 (3E), and 1800 (3F). PSSA represents poly(styrene sulfonic acid). DDHDD represents disodium hexadecyldiphenyloxide disulfonate, DDBSA represents dodecyl benzene sulfonic acid, and Z2300 represents Zeta-sperse 2300 (which includes 50 weight percent DDBSA).

Two samples of each composition were aged at 45 degrees C. to evaluate the colloidal stability of the anionic silica in the presence of the other components in the composition. The particle size of the anionic colloidal silica in each sample was measured using a Zetasizer® available from Malvern® Instruments. The particle size measurements were made at 0, 1, and 2 weeks of aging at 45 degrees C. (the zero week measurement was made soon after the sample temperature reached 45 degrees C.). Table 3B reports the average particle size value of the two samples for each composition. The differences between particle size values for the two samples were generally within one nm and never exceeded 2 nm.

TABLE 3B

| Polishing Composition | Aged Particle Size (nm) | | |
|---|---|---|---|
| | 0 week | 1 week | 2 week |
| 3A | 104.7 | 104.8 | 104.6 |
| 3B | 102.6 | 102.4 | 102.6 |
| 3C | 103.0 | 102.8 | 102.7 |

TABLE 3B-continued

| Polishing Composition | Aged Particle Size (nm) | | |
|---|---|---|---|
| | 0 week | 1 week | 2 week |
| 3D | 101.8 | 102.4 | 102.3 |
| 3E | 100.9 | 101.2 | 101.6 |
| 3F | 101.6 | 102.9 | 102.8 |

As is apparent from the results set forth in Table 3B, polishing compositions 3B, 3C, 3D, 3E, and 3F, were colloidally stable and did not exhibit particle growth. Composition 3A was colloidally stable, but the apparent increase in particle size is thought to be due to foaming caused by the DDHDD.

Example 4

Seven polishing compositions were prepared and evaluated. Each composition included 0.25 weight percent anionic alumina (an α-alumina treated with poly(2-acrylamido-2-methylpropane sulfonic acid)) having an average particle size of about 90-95 nm. Each composition further included 3240 ppm by weight malonic acid, 1500 ppm by weight ferric nitrate nonahydrate, 500 ppm by weight of L-lysine, and 15 ppm by weight Acticide® 14 biocide. The pH of each composition was adjusted to 2.3 using nitric acid. Compositions 4B, 4C, 4D, 4E, 4F, and 4G further included 50 ppm by weight (4B, 4D, and 4E) or 150 ppm by weight (4C, 4F, and 4G) (poly(styrene sulfonic acid) having an average molecular weight of 75,000 g/mol. Compositions 4D, 4E, 4F, and 4G further included 8.35 ppm by weight (4D), 25 ppm by weight (4E and 4F), or 75 ppm by weight (4G) ε-poly-L-lysine having an average molecular weight of 4000 g/mol. The amounts of PSSA and EPLL are indicated in Table 4. Table 4 further lists the ratio of the total number of negative charges on the anionic polymer to the total number of total number of positive charges on the cationic polymer at pH 2.3 as calculated using Equations 1 and 2 above.

The particle size of the anionic alumina was measured using a Horiba® LA960 article size measurement system. The particle size values are reported in Table 4.

TABLE 4

| Polishing Composition | PSSA (ppm) | εPLL (ppm) | (−)/(+) Ratio | Particle Size (nm) |
|---|---|---|---|---|
| 4A | 0 | 0 | NA | 93.2 |
| 4B | 50 | 0 | NA | 93.1 |
| 4C | 150 | 0 | NA | 93.3 |
| 4D | 50 | 8.35 | 2.8 | 94.4 |
| 4E | 50 | 25 | 0.9 | 143 |
| 4F | 150 | 25 | 2.8 | 98.5 |
| 4G | 150 | 75 | 0.9 | Settled |

As is apparent from the results set forth in Table 4, polishing compositions 4D and 4F were stable and exhibited little to no particle growth. Composition 4E was initially stable by exhibited a particle size growth of about 50 nm. Composition 4G was unstable with the anionic alumina particles rapidly settling. It is evident in this particular example that the compositions having a negative to positive charge ratio of less than 1 had poor colloidal stability as compared to the compositions having a negative to positive charge ratio of 2.8.

Example 5

Two polishing compositions were prepared and evaluated. The first (control) composition included W8700-105 (commercially available from CMC Materials) and the second included 1.5 weight percent anionic colloidal silica PL-5D available from Fuso Chemical Company), 8000 ppm by weight malonic acid, 4725 ppm by weight ferric nitrate nonahydrate, 224 ppm by weight poly(styrene sulfonic acid having an average molecular weight of 75,000 g/mol, 40 ppm by weight ε-poly-L-lysine having an average molecular weight of 4000 g/mol, and 15 ppm by weight Acticide® 14 biocide. The pH was adjusted to 2.0 using nitric acid. The composition was diluted 2 parts water to 1 part slurry composition to obtain the final polishing composition. The point of use composition included 2.0 weight percent hydrogen peroxide.

The tungsten polishing performance was evaluated for each composition. The polishing rates of tungsten blanket wafers and TEOS blanket wafers were obtained by polishing 200 mm blanket wafers having corresponding W and TEOS layers. Patterned wafer performance was obtained by polishing 200 mm 2 kÅ Silyb 854 tungsten patterned wafers (available from Silyb Wafer Services). All wafers were polished using a Mirra® CMP tool (available from Applied Materials) and a NexPlanar M2000 polishing pad (available from CMC Materials) at a down-force of 2.5 psi, a platen speed of 113 rpm, a head speed of 111 rpm, and a slurry flow rate of 150 mL/min. The wafers were polished to endpoint (EP) plus 20 percent overpolish. The blanket W and TEOS removal rates (RR) and the patterned wafer clear time are shown in Table 5A. Erosion and dishing were measured on 0.18×0.18 μm, 1×1 μm, 1×3 μm, 3×1 μm, 10×10 μm, and 50×50 μm features using atomic force microscope measurements. The erosion and dishing results are shown on Tables 5B and 5C. All values are given in units of A.

TABLE 5A

| Polishing Composition | W RR (Å/min) | TEOS RR (Å/min) | Clear Time (s) |
|---|---|---|---|
| Control | 2186 | 55 | 93 |
| 5A | 1790 | 56 | 89 |

TABLE 5B

| | Erosion | | | | | |
|---|---|---|---|---|---|---|
| Polishing Composition | 0.18 × 0.18 (Å) | 1 × 1 (Å) | 1 × 3 (Å) | 3 × 1 (Å) | 10 × 10 (Å) | 10 × 10 (Å) |
| Control | 559 | 377 | 122 | 876 | 167 | 88 |
| 5A | 142 | 60 | 43 | 149 | 21 | 16 |

TABLE 5C

| | Dishing | | | | | |
|---|---|---|---|---|---|---|
| Polishing Composition | 0.18 × 0.18 (Å) | 1 × 1 (Å) | 1 × 3 (Å) | 3 × 1 (Å) | 10 × 10 (Å) | 10 × 10 (Å) |
| Control | 78 | 162 | 215 | 144 | 661 | 1113 |
| 5A | 80 | 158 | 177 | 165 | 206 | 323 |

As is evident from the results set forth in Table 5A, 5B, and 5C, inventive composition 5A achieves much lower and more uniform dishing and erosion over a wide range of feature sizes with no throughput loss (the clear time was improved from 93 to 89 seconds).

Example 6

Two polishing compositions were prepared and evaluated. The first (control) composition included W8700-105 (commercially available from CMC Materials) and the second included 1.2 weight percent anionic colloidal silica PL-5D available from Fuso Chemical Company), 8000 ppm by weight malonic acid, 4725 ppm by weight ferric nitrate nonahydrate, 300 ppm by weight poly(styrene sulfonic acid having an average molecular weight of 75,000 g/mol, 30 ppm by weight ε-poly-L-lysine having an average molecular weight of 4000 g/mol, and 15 ppm by weight Acticide® 14 biocide. The pH was adjusted to 2.0 using nitric acid. The composition was diluted 2 parts water to 1 part slurry composition to obtain the final point of use polishing composition. The point of use composition further included 2 percent hydrogen peroxide.

The tungsten polishing performance was evaluated for each composition. Patterned wafer performance was obtained by y polishing 200 mm 2 kÅ Silyb 854 tungsten patterned wafers (available from Silyb Wafer Services). All wafers were polished using a Mirra® CMP tool (available from Applied Materials) and a NexPlanar M2000 polishing pad (available from CMC Materials) at a down-force of 2.5 psi with ex-situ conditioning using a 3M A165 disk, a platen speed of 113 rpm, a head speed of 111 rpm, and a slurry flow rate of 150 mL/min. The wafers were polished to endpoint (EP) plus 20 percent overpolish. Erosion, dishing, and field oxide loss results are shown on Tables 6A, 6B, and 6C.

TABLE 6A

| | Erosion | | | | | |
|---|---|---|---|---|---|---|
| Polishing Composition | 0.18 × 0.18 (Å) | 1 × 1 (Å) | 1 × 3 (Å) | 3 × 1 (Å) | 10 × 10 (Å) | 10 × 10 (Å) |
| Control | 522 | 328 | 113 | 763 | 132 | 56 |
| 6A | 252 | 139 | 65 | 296 | 74 | 47 |

TABLE 6B

| | Dishing | | | | | |
|---|---|---|---|---|---|---|
| Polishing Composition | 0.18 × 0.18 (Å) | 1 × 1 (Å) | 1 × 3 (Å) | 3 × 1 (Å) | 10 × 10 (Å) | 10 × 10 (Å) |
| Control | 73 | 158 | 208 | 187 | 617 | 996 |
| 6A | 57 | 93 | 106 | 92 | 204 | 323 |

TABLE 6C

| | Field Oxide Loss | | | | | |
|---|---|---|---|---|---|---|
| Polishing Composition | 0.18 × 0.18 (Å) | 1 × 1 (Å) | 1 × 3 (Å) | 3 × 1 (Å) | 10 × 10 (Å) | 10 × 10 (Å) |
| Control | 53 | 54 | 53 | 57 | 52 | 58 |
| 6A | 29 | 31 | 27 | 34 | 31 | 31 |

As is evident from the results set forth in Table 6A, 6B, and 6C, inventive composition 6A achieves much lower and more uniform dishing and erosion over a wide range of feature sizes with a significantly reduced field oxide loss across the same features.

Example 7

Six polishing compositions were prepared and evaluated. Each composition included 0.25 weight percent anionic alumina (an α-alumina treated with poly(2-acrylamido-2-methylpropane sulfonic acid)) having an average particle size of about 90-95 nm. Each composition further included 3240 ppm by weight malonic acid, 1500 ppm by weight ferric nitrate nonahydrate, 500 ppm by weight of L-lysine (7A-7E) or L-arginine (7F), and 15 ppm by weight Acticide® 14 biocide. The pH of each composition was adjusted to 2.3 using nitric acid. Compositions 7B, 7C, 7D, 7E, and 7F further included 50 ppm by weight (7C), 100 ppm by weight (7D), or 150 ppm by weight (7B, 7E, and 7F) (poly(styrene sulfonic acid) having an average molecular weight of 75,000 g/mol as follows. Compositions 7C, 7D, 7E, and 7F further included 8.35 ppm by weight (7C), 16.7 ppm by weight (7D), or 25 ppm by weight (7E and 7F) ε-poly-L-lysine having an average molecular weight of 4000 g/mol. The amounts of PSSA and EPLL are indicated in Table 7A. The ratio of the total number of negative charges on the anionic polymer to the total number of total number of positive charges on the cationic polymer for compositions 7C, 7D, 7E, and 7F was 2.8.

The tungsten polishing performance was evaluated for each composition. The polishing rates of tungsten blanket wafers and TEOS blanket wafers were obtained by polishing 200 mm blanket wafers having corresponding W and TEOS layers (for a 60 second polishing time). The blanket removal rates are shown on Table 7A. Patterned wafer performance was obtained by polishing 200 mm 2 kÅ Silyb 854 tungsten patterned wafers (available from Silyb Wafer Services). Patterned wafer data is shown on Table 7B.

All wafers were polished using a Mirra® CMP tool (available from Applied Materials) and a NexPlanar M2000 polishing pad (available from CMC Materials) at a downforce of 2.5 psi, a platen speed of 115 rpm, a head speed of 109 rpm, and a slurry flow rate of 150 mL/min. The wafers were polished to endpoint (EP) plus 30 second over-polish. The patterned tungsten removal rate (RR), the patterned wafer clear time, and 1×1 μm array dishing and erosion are shown on Table 7B. All values are given in units of A.

TABLE 7A

| Polishing Composition | PSSA (ppm) | εPLL (ppm) | W RR (Å/min) | TEOS RR (Å/min) |
|---|---|---|---|---|
| 7A | 0 | 0 | 2428 | 37 |
| 7B | 150 | 0 | 2481 | 42 |
| 7C | 50 | 8.33 | 2450 | 42 |
| 7D | 100 | 16.66 | 2286 | 40 |
| 7E | 150 | 25 | 1495 | 35 |
| 7F | 150 | 25 | 1566 | 35 |

TABLE 7B

| Polishing Composition | W RR (Å/min) | Clear Time (sec) | Dishing 1 × 1 (Å) | Erosion 1 × 1 (Å) |
|---|---|---|---|---|
| 7A | 1791 | 210 | 181 | 406 |
| 7B | 1394 | 270 | 166 | 362 |
| 7C | 1430 | 270 | 172 | 321 |
| 7D | 1425 | 277 | 145 | 391 |
| 7E | 1386 | 277 | 129 | 322 |
| 7F | 1322 | 283 | 123 | 303 |

As is readily apparent from the data set forth in Tables 7A and 7B, compositions 7C, 7E, and 7F show improved erosion performance, while compositions 7D, 7E, and 7F show improved dishing performance. The patterned W RR and patterned wafer clear time were similar for compositions 7B, 7C, 7D, 7E, and 7F.

Example 8

Five polishing compositions were prepared and evaluated. Each composition included 0.3125% weight percent treated alpha alumina (an α-alumina treated with poly(acrylic acid)-co-poly (2-acrylamido 2-methylpropane sulfonic acid) having an average particle size of about 60 nm. Each composition further included 1620 ppm by weight malonic acid, 750 ppm by weight ferric nitrate nonahydrate, 125 ppm by weight Igepal CA630 (CAS #9002-93-1), 375 ppm by weight TSF-20 (CAS #65143-89-7), 250 ppm by weight L-Arginine, and 15 ppm by weight Acticide 14 biocide, a cationic polymer (ε-poly-L-lysine or poly DADMAC), and an anionic polymer PSSA. The pH of each composition was adjusted to 2.3 using nitric acid. Table 8A shows the particular cationic polymer and anionic polymer used in these compositions. The amounts are given in parts per million by weight. Table 8A further lists the ratio of the total number of negative charges on the anionic polymer to the total number of total number of positive charges on the cationic polymer at pH 2.3 as calculated using Equations 1 and 2 above.

TABLE 8A

| Polishing Composition | Cationic Polymer | Anionic Polymer/ Surfactant (ppm) | (−)/(+) Ratio |
|---|---|---|---|
| 8A | 30 ppm ε-poly-L-lysine | 200 ppm PSSA | 3.3 |
| 8B | 30 ppm ε-poly-L-lysine | 300 ppm PSSA | 4.9 |
| 8C | 30 ppm ε-poly-L-lysine | 500 ppm PSSA | 8.2 |
| 8D | 45 ppm polyDADMAC | 450 ppm PSSA | 6.9 |
| 8E | 60 ppm polyDADMAC | 600 ppm PSSA | 6.9 |

Two samples of each composition were aged at 45 degrees C. to evaluate the colloidal stability of the anionic silica in the presence of the other components in the composition. The particle size of the anionic colloidal silica in each sample was measured using a Zetasizer® available from Malvern® Instruments. The particle size measurements were made at 0, 1, and 2 weeks of aging at 45 degrees C. (the zero week measurement was made soon after the sample temperature reached 45 degrees C.). Table 8B reports the average particle size value of the two samples for each composition. The differences between particle size values for the two samples were generally within one nm and never exceeded 2 nm.

TABLE 8B

| Polishing Composition | Aged Particle Size (nm) | | |
|---|---|---|---|
| | 0 week | 1 week | 2 week |
| 8A | 121.6 | 122.5 | Settled |
| 8B | 123.5 | 122.8 | 123.2 |
| 8C | 122.7 | 121.9 | 122.7 |
| 8D | 125.3 | 126.2 | 124.5 |
| 8E | 124.6 | 124.3 | 125.4 |

As is apparent from the results set forth in Table 8B, polishing compositions 8B, 8C, 8D, and 8E were colloidally stable and did not exhibit particle growth. Composition 8A was initially colloidally stable and did not initially exhibit particle growth, but settled after two weeks at 45 degrees C.

Example 9

Two polishing compositions were prepared and evaluated. The first (control) composition included W8052-63 & W8052-185 (commercially available from CMC Materials). The second (9A) composition was identical to composition 8E described above with respect to Example 8. The tungsten polishing performance was evaluated for each composition. Patterned wafer performance was obtained by polishing 200 mm 2 kÅ Silyb 754 tungsten patterned wafers (available from Silyb Wafer Services). All wafers were polished using a Mirra® CMP tool (available from Applied Materials) and a NexPlanar E6088 polishing pad (available from CMC Materials) in a two-step process in which the platen speed was 113 rpm, the head speed was 111 rpm, and the slurry flow rate was 150 mL/min. In the control, the wafers were first polished with W8052-63 with a downforce of 2 psi until flag time (until the tungsten layer started to clear) and with W8052-185 with a downforce of 1.5 psi until endpoint plus a 20 percent overpolish. In the inventive example, the wafers were polished with composition 9A at 3 psi until flag time and then at 1 psi to endpoint (EP) plus 20 percent overpolish. Tungsten removal rates and process time, erosion, dishing, and field oxide loss results are shown on Tables 9A, 9B, 9C, and 9D.

TABLE 9A

Tungsten Removal Rates

| Polishing Composition | Process 1 W RR (Å/min) | Process 1 Time (sec) | Process 2 W RR (Å/min) | Process 2 Time (sec) |
|---|---|---|---|---|
| Control | 1517 (W8052-63) | 90 | 380 (W8052-185) | 148 |
| 9A | 1177 | 116 | 380 | 131 |

TABLE 9B

Erosion

| Polishing Composition | 0.18 × 0.18 (Å) | 1 × 1 (Å) | 3 × 1 (Å) | 7 × 3 (Å) | 10 × 10 (Å) |
|---|---|---|---|---|---|
| Control | 324 | 265 | 480 | 317 | 119 |
| 9A | 17 | 8 | 31 | 61 | −6 |

TABLE 9C

Dishing

| Polishing Composition | 1 × 1 (Å) | 3 × 1 (Å) | 7 × 3 (Å) | 10 × 10 (Å) |
|---|---|---|---|---|
| Control | 191 | 180 | 293 | 468 |
| 9A | 116 | 128 | 201 | 264 |

TABLE 9D

Field Oxide Loss

| Polishing Composition | 0.18 × 0.18 (Å) | 10 × 10 (Å) |
|---|---|---|
| Control | 39 | 50 |
| 9A | 14 | 19 |

As is evident from the results set forth in Table 9B, 9C, and 9D, inventive composition 9A achieves much lower and more uniform dishing and erosion over a wide range of feature sizes with a significantly reduced field oxide loss across the same range of features. Moreover, as is evident from the results set forth in Table 9A, inventive composition 9A achieves this significantly improved pattern wafer performance while also achieving comparable tungsten removal rates and a comparable overall process time. It will be appreciated that inventive composition 9A achieves these results using a single polishing composition and thus may provide equal throughput or even improve throughput since there is no requirement to change the polishing composition at flag time and therefore no time delay introduced with the composition change (a typical time delay is on the order of at least 10 seconds and is not listed in Table 9A).

It will be understood that the recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition comprising:
   a liquid carrier;
   anionic particles dispersed in the liquid carrier;
   a cationic polymer; and
      an anionic polymer, further comprising:
   an iron-containing accelerator; and
   a stabilizer bound to the iron-containing accelerator.

2. The composition of claim 1, wherein the anionic particles comprise anionic silica, anionic alumina, or a mixture thereof.

3. The composition of claim 1, further comprising hydrogen peroxide.

4. The composition of claim 1, wherein a ratio of a total number of negative charges on the anionic polymer to a total number of positive charges on the cationic polymer at a pH of the composition is greater than about 1:1.

5. The composition of claim 1, wherein a ratio of a total number of negative charges on the anionic polymer to a total number of positive charges on the cationic polymer is in a range from about 1:1 to about 10:1.

6. The composition of claim 1, wherein:
the anionic particles comprise anionic colloidal silica particles; and
a ratio of a total number of negative charges on the anionic polymer to a total number of positive charges on the cationic polymer at a pH of the composition is greater than about 1:1.

7. The composition of claim 1, wherein:
the anionic particles comprise anionic alpha alumina particles; and
a ratio of a total number of negative charges on the anionic polymer to a total number of positive charges on the cationic polymer at a pH of the composition is greater than about 3.5.

8. The composition of claim 1, wherein the anionic polymer comprises a polysulfonic acid polymer.

9. The composition of claim 1, wherein the anionic polymer is a polysulfonic acid polymer comprising sulfonic acid monomer units, the polysulfonic acid polymer selected from the group consisting of polyvinylsulfonic acid, polystyrenesulfonic acid, poly (2-acrylamido-2-methylpropane sulfonic acid), poly (styrenesulfonic acid-co-maleic acid), and mixtures thereof.

10. The composition of claim 1, wherein the anionic polymer comprises polyvinylsulfonic acid, polystyrenesulfonic acid, or a mixture thereof.

11. The composition of claim 1, wherein the cationic polymer comprises a polyamino acid.

12. The composition of claim 1, wherein the cationic polymer comprises polylysine.

13. The composition of claim 1, wherein the cationic polymer comprises a monomer including a quaternary amine group.

14. The composition of claim 1, wherein the cationic polymer comprises poly(diallyldimethylammonium).

15. The composition of claim 1, wherein the anionic particles comprises anionic silica; the anionic polymer comprises of a polysulfonic acid polymer; and the cationic polymer comprises a polyamino acid.

16. The composition of claim 15, wherein the cationic polymer comprises polylysine; and a ratio of a total number of negative charges on the anionic polymer to a total number of positive charges on the cationic polymer is in a range from about 1:1 to about 20:1.

17. The composition of claim 16, wherein:
the composition comprises from about 20 to about 2000 ppm by weight of polystyrenesulfonic acid at point of use; and
the composition comprises from about 2 to about 50 ppm by weight of the polylysine at point of use.

18. The composition of claim 1, wherein the anionic particles comprise anionic alpha alumina; the anionic polymer comprises a polysulfonic acid polymer; and the cationic polymer comprises a monomer including a quaternary amine group.

19. The composition of claim 18, wherein the cationic polymer comprises poly(diallyldimethylammonium); and a ratio of a total number of negative charges on the anionic polymer to a total number of positive charges on the cationic polymer is in a range from about 3.5:1 to about 20:1.

20. The composition of claim 19, wherein:
the composition comprises from about 20 to about 2000 ppm by weight of polystyrenesulfonic acid at point of use; and
the composition comprises from about 20 to about 200 ppm by weight of the poly(diallyldimethylammonium) at point of use.

21. The composition of claim 1, wherein the anionic particles have a negative charge of at least 10 mV in the polishing composition.

22. The composition of claim 1, comprising less than about 1 weight percent of the anionic particles at point of use.

23. The composition of claim 1, having a pH in a range from about 2 to about 5.

24. A method of chemical mechanical polishing a substrate having a tungsten layer or a molybdenum layer, the method comprising:
(a) contacting the substrate with a polishing composition of claim 1;
(b) moving the polishing composition relative to the substrate; and
(c) abrading the substrate to remove a portion of the tungsten layer or the molybdenum layer from the substrate and thereby polish the substrate.

25. The method of claim 24, wherein:
the anionic particles comprise anionic silica;
the anionic polymer comprises a polysulfonic acid polymer; and
the cationic polymer comprises a polyamino acid.

26. The method of claim 25, wherein
the polishing composition further comprises an iron-containing accelerator and a stabilizer bound to the iron-containing accelerator;
the cationic polymer comprises polylysine and
a ratio of a total number of negative charges on the anionic polymer to a total number of positive charges on the cationic polymer is in a range from about 1:1 to about 20:1.

27. The method of claim 24, wherein:
the anionic particles comprise anionic alpha alumina;
the anionic polymer comprises a polysulfonic acid polymer; and
the cationic polymer comprises a monomer including a quaternary amine group.

28. The method of claim 27, wherein
the polishing composition further comprises an iron-containing accelerator and a stabilizer bound to the iron-containing accelerator;
the cationic polymer comprises poly(diallyldimethylammonium); and
a ratio of a total number of negative charges on the anionic polymer to a total number of positive charges on the cationic polymer is in a range from about 3.5:1 to about 20:1.

* * * * *